(12) United States Patent
Wang (10) Patent No.: US 10,586,859 B2
(45) Date of Patent: Mar. 10, 2020

(54) SEMICONDUCTOR DEVICE AND FABRICATION METHOD THEREOF

(71) Applicants: Semiconductor Manufacturing International (Shanghai) Corporation, Shanghai (CN); SMIC New Technology Research and Development (Shanghai) Corporation, Shanghai (CN)

(72) Inventor: Qing Peng Wang, Shanghai (CN)

(73) Assignees: Semiconductor Manufacturing International (Shanghai) Corporation, Shanghai (CN); SMIC New Technology Research and Development (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/117,804

(22) Filed: Aug. 30, 2018

(65) Prior Publication Data
US 2019/0148235 A1    May 16, 2019

(30) Foreign Application Priority Data

Nov. 13, 2017  (CN) .......................... 2017 1 1116553

(51) Int. Cl.
*H01L 29/66* (2006.01)
*H01L 21/8234* (2006.01)
(Continued)

(52) U.S. Cl.
CPC ...... *H01L 29/6681* (2013.01); *H01L 21/0273* (2013.01); *H01L 21/02164* (2013.01); *H01L 21/3081* (2013.01); *H01L 21/3086* (2013.01); *H01L 21/30604* (2013.01); *H01L 21/31053* (2013.01); *H01L 21/76224* (2013.01); *H01L 21/823431* (2013.01);
(Continued)

(58) Field of Classification Search
CPC ......... H01L 21/823431; H01L 27/0886; H01L 29/6681; H01L 29/66795
See application file for complete search history.

(56) References Cited

U.S. PATENT DOCUMENTS

| | | | |
|---|---|---|---|
| 8,513,131 B2* | 8/2013 | Cai | H01L 21/3086 246/12 |
| 9,418,994 B1* | 8/2016 | Chao | H01L 27/0886 |
| 9,520,469 B1* | 12/2016 | Balakrishnan | H01L 21/823821 |
| 9,799,570 B1* | 10/2017 | Cheng | H01L 21/823878 |

(Continued)

*Primary Examiner* — Bac H Au
(74) *Attorney, Agent, or Firm* — Anova Law Group, PLLC (57) ABSTRACT

A semiconductor structure and a method for fabricating the semiconductor structure are provided. The method includes providing a semiconductor substrate including a dense region and a sparse region. The method also includes forming initial fins equally spaced apart from one another on the semiconductor substrate, the initial fins including a plurality of intrinsic fins and dummy fins. The intrinsic fins on the dense region has a spatial density greater than the intrinsic fins on the sparse region. In addition, the method includes forming a first isolation layer on the semiconductor substrate. The first isolation layer covers a portion of sidewalls of the dummy fins and a portion of sidewalls of the intrinsic fins. Further, the method includes forming first trenches in the first isolation layer by removing the dummy fins, and forming a second isolation layer in the first trenches.

17 Claims, 7 Drawing Sheets

(51) Int. Cl.
*H01L 21/762* (2006.01)
*H01L 21/306* (2006.01)
*H01L 21/308* (2006.01)
*H01L 21/027* (2006.01)
*H01L 21/3105* (2006.01)
*H01L 21/02* (2006.01)
*H01L 29/06* (2006.01)
*H01L 27/088* (2006.01)
*H01L 27/02* (2006.01)

(52) U.S. Cl.
CPC ........ *H01L 21/823437* (2013.01); *H01L 21/823481* (2013.01); *H01L 27/0207* (2013.01); *H01L 27/0886* (2013.01); *H01L 29/0649* (2013.01); *H01L 29/6656* (2013.01)

(56) References Cited

U.S. PATENT DOCUMENTS

| | | | |
|---|---|---|---|
| 9,991,131 B1* | 6/2018 | Sung | H01L 21/823431 |
| 10,014,297 B1* | 7/2018 | Sun | H01L 27/0886 |
| 2013/0277760 A1* | 10/2013 | Lu | H01L 29/10 |
| | | | 257/401 |
| 2014/0138773 A1* | 5/2014 | Cheng | H01L 21/3086 |
| | | | 257/347 |
| 2014/0145248 A1* | 5/2014 | Cheng | H01L 21/02227 |
| | | | 257/288 |
| 2016/0013183 A1* | 1/2016 | Basker | H01L 27/0886 |
| | | | 257/401 |
| 2017/0213767 A1* | 7/2017 | Sung | H01L 21/823431 |
| 2018/0096999 A1* | 4/2018 | Zhou | H01L 21/76229 |
| 2019/0019731 A1* | 1/2019 | Lin | H01L 21/823431 |

* cited by examiner

I # SEMICONDUCTOR DEVICE AND FABRICATION METHOD THEREOF

CROSS-REFERENCES TO RELATED APPLICATIONS

This application claims the priority of Chinese patent application No. 201711116553.3, filed on Nov. 13, 2017, the entirety of which is incorporated herein by reference.

FIELD OF THE DISCLOSURE

The present disclosure generally relates to the field of semiconductor manufacturing and, more particularly, relates to a semiconductor device and fabrication method thereof.

BACKGROUND

Metal-oxide-semiconductor (MOS) transistors are one of the most important components in modern integrated circuits. A basic structure of the MOS transistor includes a semiconductor substrate, a gate structure on a surface of the semiconductor substrate, and source and drain doped regions in the semiconductor substrate on both sides of the gate structure. The gate structure includes a gate dielectric layer on the surface of the semiconductor substrate and a gate electrode layer on a surface of the gate dielectric layer.

With the development of semiconductor technologies, the control capability of the conventional planar MOS transistor over a channel current becomes weaker, causing a serious leakage current. A fin field effect transistor (FinFET) is one of emerging multifaceted-gate devices. The FinFET generally includes one or more protruding fins on a surface of a semiconductor substrate, a gate structure across a length portion of the fin and covering a portion of each of top and sidewall surfaces of the fin, and source and drain doped regions in the fin on both sides of the gate structure.

However, the performance of the semiconductor device conventionally formed by the FinFET still needs to be improved. The disclosed methods and device structures are directed to solve one or more problems set forth above and other problems.

BRIEF SUMMARY OF THE DISCLOSURE

One aspect of the present disclosure includes a method for fabricating a semiconductor structure. The method includes providing a semiconductor substrate. The semiconductor substrate includes a dense region and a sparse region. The method also includes forming initial fins equally spaced apart from one another on the semiconductor substrate, the initial fins including a first fin group, a second fin group, and dummy fins. The first fin group is formed on the sparse region of the semiconductor substrate, the second fin group is formed on the dense region of the semiconductor substrate, and the first fin group and the second fin group each includes a plurality of intrinsic fins. A spatial density of the intrinsic fins on the dense region is greater than a spatial density of the intrinsic fins on the sparse region. The dummy fins are formed on both sides of the first fin group, on both sides of the second fin group, and between adjacent intrinsic fins on the sparse region, respectively. In addition, the method includes forming a first isolation layer on the semiconductor substrate. The first isolation layer covers a portion of sidewalls of the dummy fins and a portion of sidewalls of the intrinsic fins. Further, the method includes forming first trenches in the first isolation layer by removing the dummy fins, and forming a second isolation layer in the first trenches.

Another aspect of the present disclosure includes a semiconductor structure. The semiconductor structure includes a semiconductor substrate. The semiconductor substrate includes a dense region and a sparse region. The semiconductor structure also includes a plurality of intrinsic fins on the semiconductor substrate. A spatial density of the intrinsic fins on the dense region is greater than a spatial density of the intrinsic fins on the sparse region. Further, the semiconductor structure includes an isolation structure including a first isolation layer and a second isolation layer on the semiconductor substrate between adjacent intrinsic fins. The first isolation layer covers a portion of sidewalls of the intrinsic fins, and has a uniform height.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
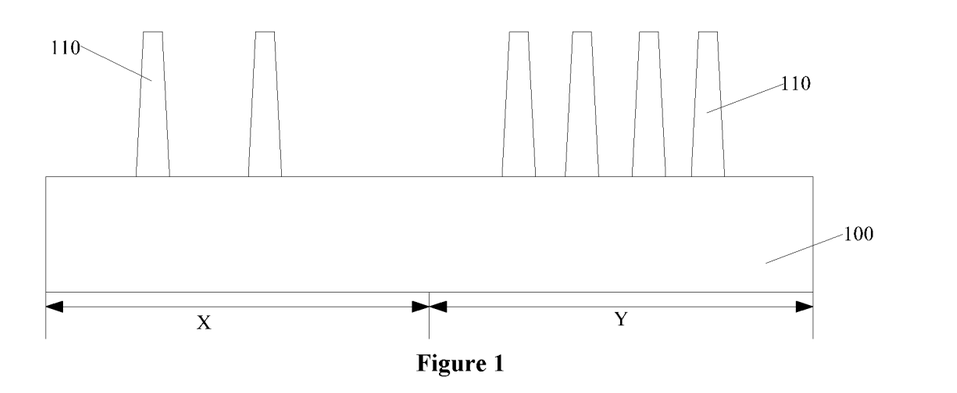
FIGS. 1-3 illustrate semiconductor structures corresponding to certain stages for forming a semiconductor structure.
Figure 2:
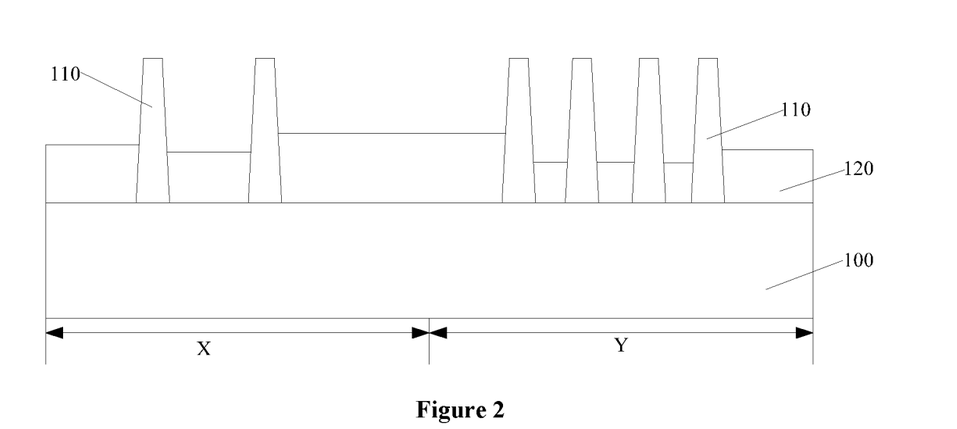
Figure 3:
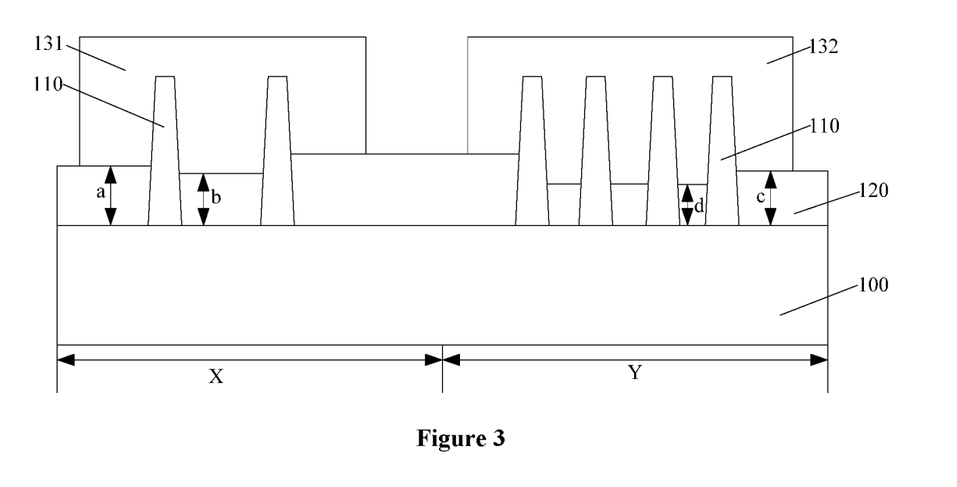

FIGS. 1-3 illustrate semiconductor structures corresponding to certain stages for forming a semiconductor structure. Referring to FIG. 1, a semiconductor substrate 100 is provided. The semiconductor substrate 100 includes a sparse region X and a dense region Y. A plurality of discrete fins 110 are formed on the semiconductor substrate 100, and a spatial density of the fins 110 in the sparse region X is less than a spatial density of the fins 110 in the dense region Y.

Referring to FIG. 2, an isolation layer 120 is formed on the semiconductor substrate 100. The isolation layer 120 covers a portion of sidewalls of the fins 110 in the sparse region X and a portion of sidewalls of the fins 110 in the dense region Y.

Referring to FIG. 3, a first gate structure 131 is formed on the isolation layer 120 to cross a length portion of the fin 110 in the sparse region X. A second gate structure is formed on the isolation layer 120 to cross a length portion of the fin 110 in the dense region Y.

Forming the isolation layer 120 includes forming an isolation material layer on the semiconductor substrate 100 and on the fins 110; planarizing the isolation material layer until top surfaces of the fins 110 are exposed; and back-etching the isolation material layer to form the isolation layer 120.

A spacing between adjacent fins 110 in the sparse region X is larger than a spacing between adjacent fins 110 in the dense region Y. Based on an etch loading effect, due to consumption of etching gas being greater than supply, when forming the isolation layer 120, the spare region has a reduction degree of an etching rate smaller than the dense region. Therefore, a height of the isolation layer 120 formed between the adjacent fins 110 in the sparse region X is significantly different from a height of the isolation layer 120 formed between the adjacent fins 110 in the dense region Y.

For illustrative purposes, the fins 110 in the sparse region X form a first fin group, and the fins 110 in the dense region Y form a second fin group. For a fin on an edge of the sparse region X, a region on one side of the fin close to the edge of the sparse region X is substantially larger than a region between the adjacent fins, and, thus, an area of the isolation material layer on the one side of the fin close to the edge of the sparse region X that needs to be etched is substantially larger. Correspondingly, the region on the one side of the fin close to the edge of the sparse region X consumes substantially more etching gas, and has the substantially larger reduction degree of the etching rate due to consumption of the etching gas being greater than supply. For a fin on an edge of the dense region Y, a region on one side of the fin close to the edge of the dense region Y is substantially larger than a region between adjacent fins, and, thus, an area of the isolation material layer on the one side of the fin close to the edge of the dense region Y that needs to be etched is substantially larger. Correspondingly, the region on the one side of the fin close to the edge of the dense region Y consumes substantially more etching gas, and has substantially larger reduction degree of the etching rate due to consumption of the etching gas being greater than supply. Therefore, the height of the isolation layer 120 formed on both sides of the first fin group is substantially larger than the height of the isolation layer 120 between adjacent fins on the sparse region X, and the height of the isolation layer 120 formed on both sides of the second fin group is substantially larger than the height of the isolation layer 120 between adjacent fins on the dense region Y.

Accordingly, a height difference (a–b) of the isolation layer 120 on both sides of the fin on the edge of the sparse region X is substantially large, and a height difference (c–d) of the isolation layer 120 on both sides of the fin on the edge of the dense region Y is substantially large. A height difference between the sidewalls on both sides of the fin crossed by the first gate structure is substantially large, and a height difference between the sidewalls on both sides of the fin crossed by the second gate structure is substantially large. The control of each of the first gate structure and the second gate structure on channels on both insides of the fin is significantly different, resulting in a serious leakage in the transistor.

The present disclosure provides a semiconductor structure and a method for forming the semiconductor structure. A first fin group, a second fin group and dummy fins may be formed on a semiconductor structure. The first fin group and the second fin group may be correspondingly formed on the sparse region of the semiconductor structure and on the dense region of the semiconductor structure, respectively. The first fin group and the second fin group each may include a plurality of intrinsic fins. A spatial density of the intrinsic fins on the dense region may be greater than a spatial density of the intrinsic fins on the sparse region. The dummy fins may be formed on both sides of the first fin group, on both sides of the second fin group, and between adjacent intrinsic fins on the sparse region, respectively. A first isolation layer may be formed on the semiconductor structure to cover a portion of sidewalls of the dummy fins and a portion of sidewalls of the intrinsic fins. The dummy fins may be removed to form first trenches in the first isolation layer, and a second isolation layer may be formed in the first trenches. The semiconductor device formed by the disclosed method may have improved performance.

Figure 14:
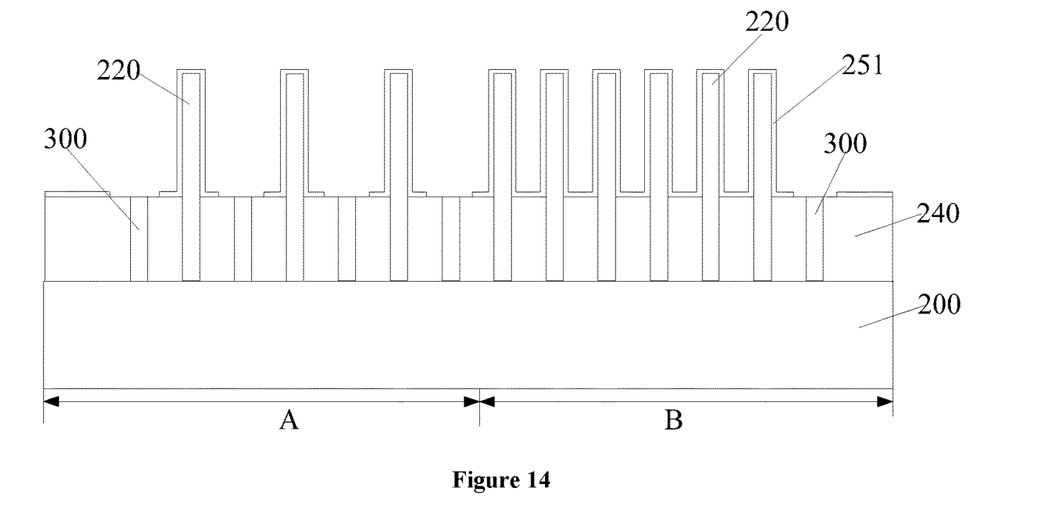
Figure 15:
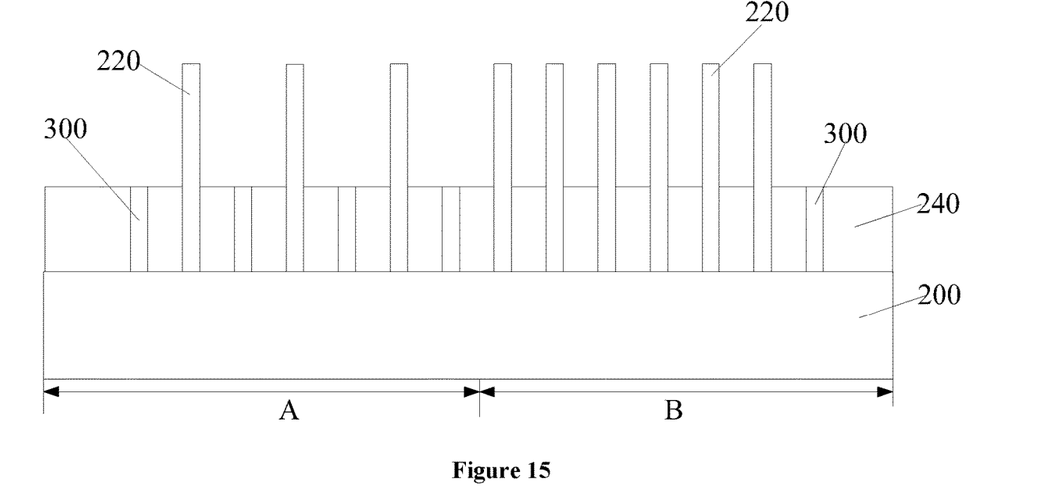
Figure 16:
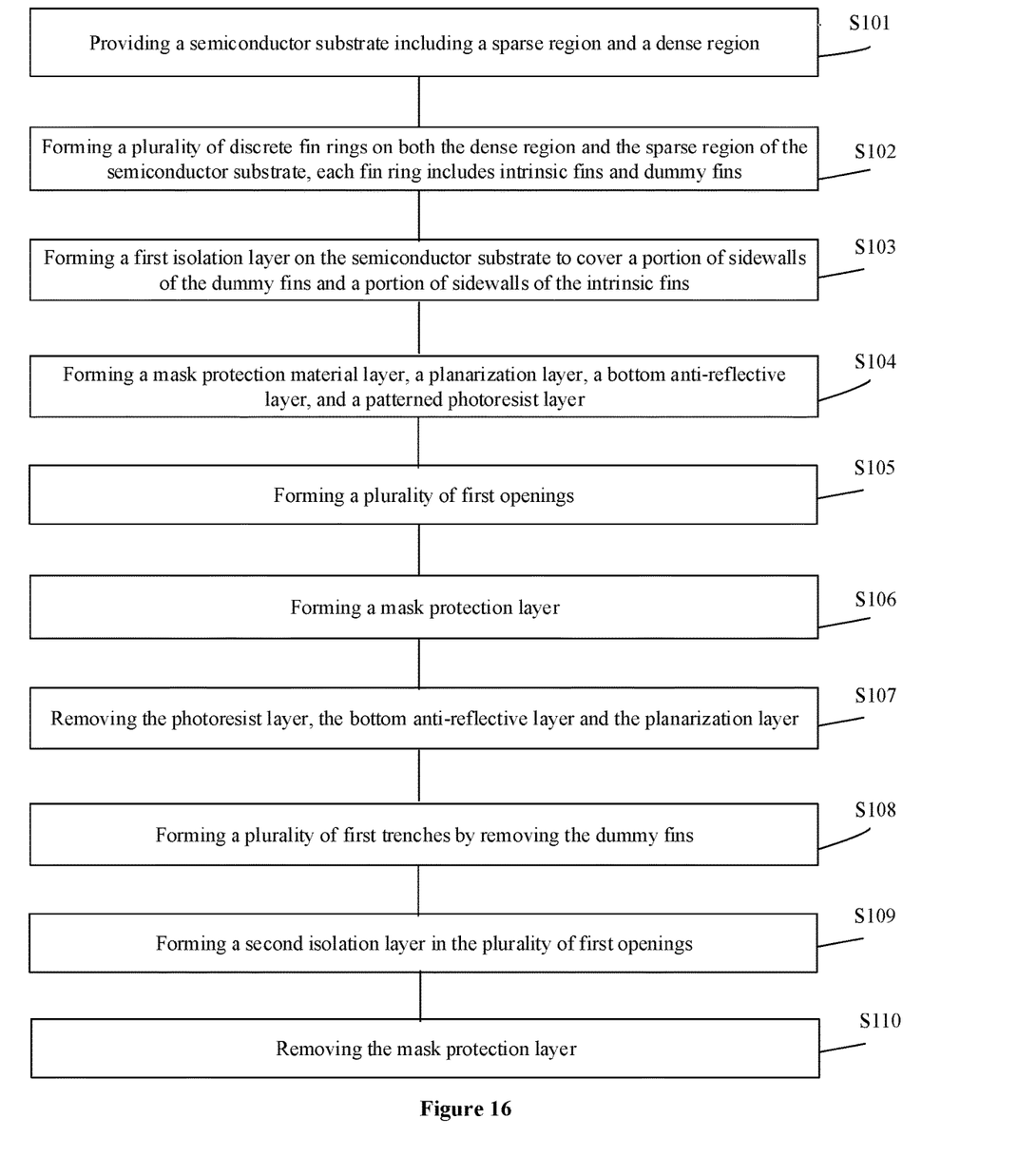
FIG. 16 illustrates an exemplary fabrication method for forming a semiconductor structure consistent with various disclosed embodiments of the present disclosure.

FIG. 16 illustrates an exemplary fabrication method for forming a semiconductor structure consistent with various disclosed embodiments of the present disclosure; and FIGS. 4-15 illustrate semiconductor structures corresponding to certain stages of the exemplary fabrication method.

Figure 4:
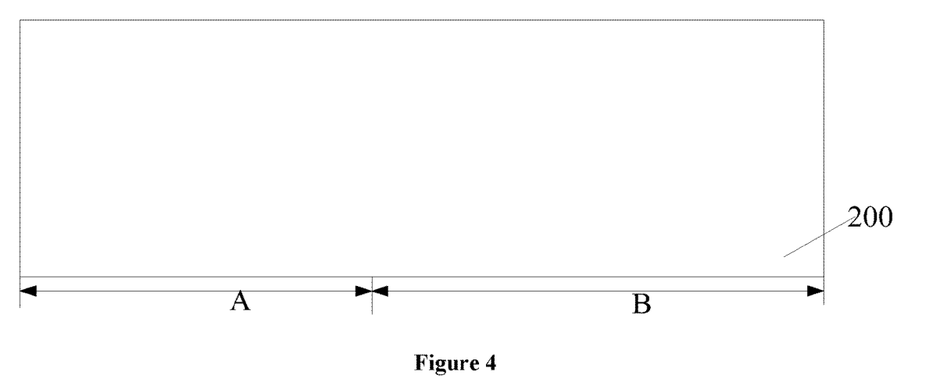
FIGS. 4-15 illustrate semiconductor structures corresponding to certain stages for forming an exemplary semiconductor structure consistent with various disclosed embodiments of the present disclosure.

As shown in FIG. 16, at the beginning of the fabrication method, a substrate with certain structures may be provided (S101). FIG. 4 illustrates a corresponding semiconductor structure.

Referring to FIG. 4, a semiconductor substrate 200 may be provided. The semiconductor substrate 200 may include a sparse region 'A' and a dense region 'B'. In one embodiment, the semiconductor substrate 200 may be made of monocrystalline silicon, polysilicon, or amorphous silicon. In another embodiment, the semiconductor substrate 200 may be made of silicon, germanium, silicon germanium, or any other suitable semiconductor material(s). In one embodiment, the semiconductor substrate 200 may be made of monocrystalline silicon.

In one embodiment, the semiconductor substrate 200 may include the sparse region 'A' and the dense region 'B'. A spatial density of intrinsic fins subsequently formed on the dense region 'B' may be greater than a spatial density of intrinsic fins subsequently formed on the sparse region 'A'.

A first fin group, a second fin group, and a plurality of dummy fins may be subsequently formed on the semiconductor substrate 200. The first fin group may be formed on the sparse region 'A' of the semiconductor substrate 200. The second fin group may be formed on the dense region 'B' of the semiconductor structure 200. The first fin group and the second fin group each may include a plurality of intrinsic fins. The spatial density of the intrinsic fins on the dense region may be greater than the spatial density of the intrinsic fins on the sparse region. The dummy fins may be formed on both sides of the first fin group, on both sides of the second fin group, and between adjacent intrinsic fins on the sparse region, respectively.

In one embodiment, additional fins may be formed on the semiconductor substrate 200. The intrinsic fins and the dummy fins may be referred to initial fins, and the additional fins and the initial fins may form a plurality of discrete fin rings. In each fin ring, the initial fins may be arranged opposite to each other, and the additional fins may be arranged opposite to each other. Two ends of an additional fin may be connected with adjacent initial fins, respectively. An arrangement direction of the initial fins may be perpendicular to a length direction of the initial fin, and an arrangement direction of the additional fins may be parallel to a length direction of the additional fin.

Forming the first fin group, the second fin group, the dummy fins, and the additional fins is described in detail as follows.

Figure 5:
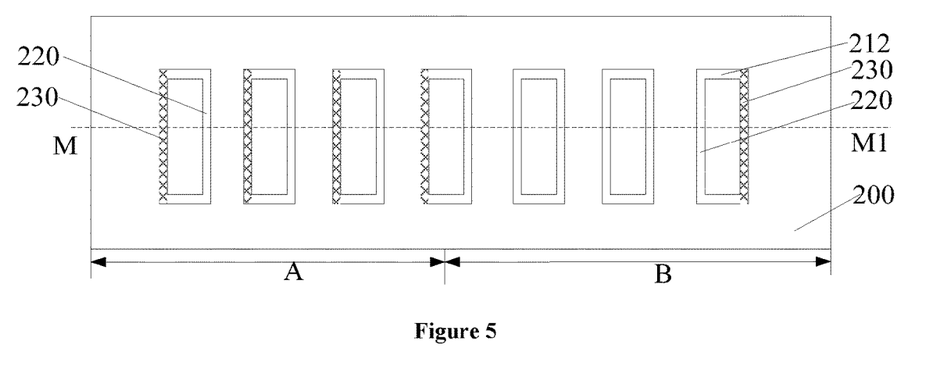
Figure 6:
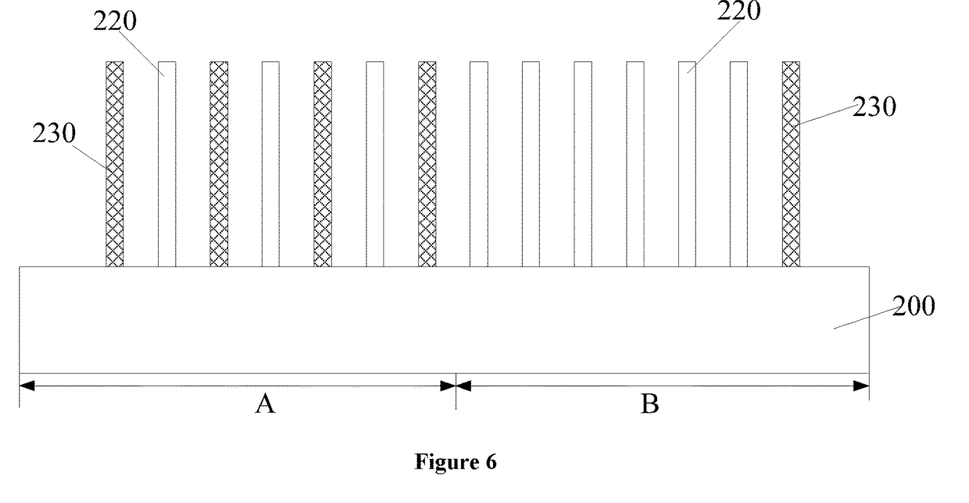

Returning to FIG. 16, after providing the semiconductor substrate including the sparse region 'A' and the dense region, a plurality of discrete fin rings may be formed (S102). FIGS. 5-6 illustrate a corresponding semiconductor structure. FIG. 5 illustrates a schematic diagram formed on the basis of FIG. 4, and FIG. 6 illustrates a cross-sectional view along a line 'M-M1' in FIG. 5.

Referring to FIGS. 5-6, a plurality of discrete fin rings may be formed on both the dense region 'B' and the sparse region 'A' of the semiconductor substrate 200. Each fin ring may include initial fins opposing to each other and additional fins 212 opposing to each other. In each fin ring, two ends of the additional fin 212 may be connected with adjacent initial fins, respectively. An arrangement direction of the initial fins may be perpendicular to a length direction of the initial fin, and an arrangement direction of the additional fins 212 may be parallel to a length direction of the additional fin 212.

The initial fins may be made of monocrystalline silicon, or monocrystalline silicon germanium, etc. In another embodiment, the initial fins may be made of any other suitable semiconductor material(s). In one embodiment, the initial fins may be equally spaced.

In one embodiment, forming the plurality of fin rings may include a double patterning process. For example, forming the plurality of fin rings may include: forming a fin material layer (not illustrated) on both the dense region 'B' and the sparse region 'A' of the semiconductor substrate 200; forming a plurality of discrete sacrificial layers (not illustrated) on the fin material layer on both the dense region 'B' and the sparse region 'A'; forming first sidewall spacers on sidewalls of two sides of each sacrificial layer, and forming second sidewall spacers on other two sides of the sacrificial layer when forming the first sidewall spacers, where two ends of the second sidewall spacer may be connected with adjacent first sidewall spacers, respectively, and the second sidewall spacers and the first sidewall spacers may form a ring structure; after forming the first sidewall spacers and the second sidewall spacers, removing the sacrificial layers; after removing the sacrificial layers, etching the fin material layer using the first sidewall spacers and the second sidewall spacers as a mask to form the plurality of fin rings on both the dense region 'B' and the sparse region 'A' of the semiconductor substrate 200; and after etching the fin material layer using the first sidewall spacers and the second sidewall spacers as a mask, removing the first sidewall spacers and the second sidewall spacers.

The sacrificial layer may be made of polysilicon, or amorphous carbon, etc. In one embodiment, the first sidewall spacer and the second sidewall spacer may be made of silicon oxide. In another embodiment, the first sidewall spacer and the second sidewall spacer may be made of silicon nitride.

In one embodiment, the sacrificial layer may have a cuboid shape, and the first sidewall spacers and the second sidewall spacers may form a rectangular ring structure. In another embodiment, the sacrificial layer may have a cube shape, and the first sidewall spacers and the second sidewall spacers may form a square ring structure.

A number of the initial fins may be intrinsic fins 220, and a number of the initial fins may be dummy fins 230. In one embodiment, a number of the initial fins on the sparse region 'A' may be the intrinsic fins 220 on the sparse region 'A' and form a first fin group. A number of the initial fins on the dense region 'B' may be the intrinsic fins 220 on the dense region 'B' and form a second fin group. A number of the initial fins on both the sparse region 'A' and the dense region 'B' may be the dummy fins 230.

A spatial density of the intrinsic fins 220 on the dense region 'B' may be greater than a spatial density of the intrinsic fins 220 on the sparse region 'A'. The dummy fins 230 may be formed on both sides of the first fin group, on both sides of the second fin group, and between adjacent intrinsic fins 220 on the sparse region 'A'.

The number of the dummy fins 230 between the adjacent intrinsic fins 220 on the sparse region 'A' may be one or more. In one embodiment, the dummy fin 230 may not be formed between the adjacent intrinsic fins 220 on the dense region 'B'. In one embodiment, the dummy fins 230 may be formed on both sides of the first fin group, on both sides of the second fin group, and between the adjacent intrinsic fins 220 on the sparse region 'A', respectively.

Figure 7:
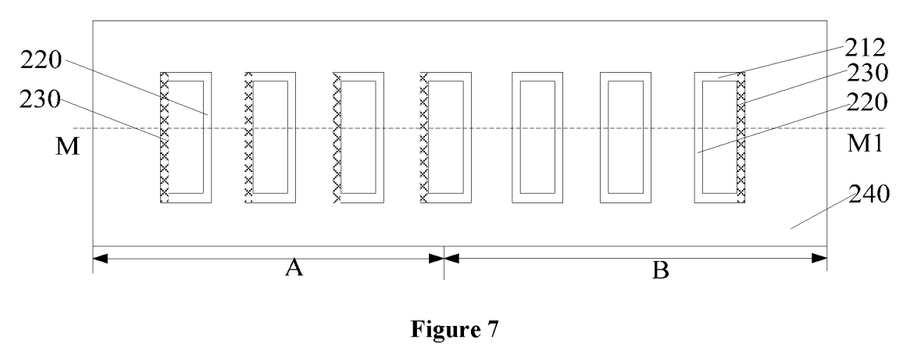
Figure 8:
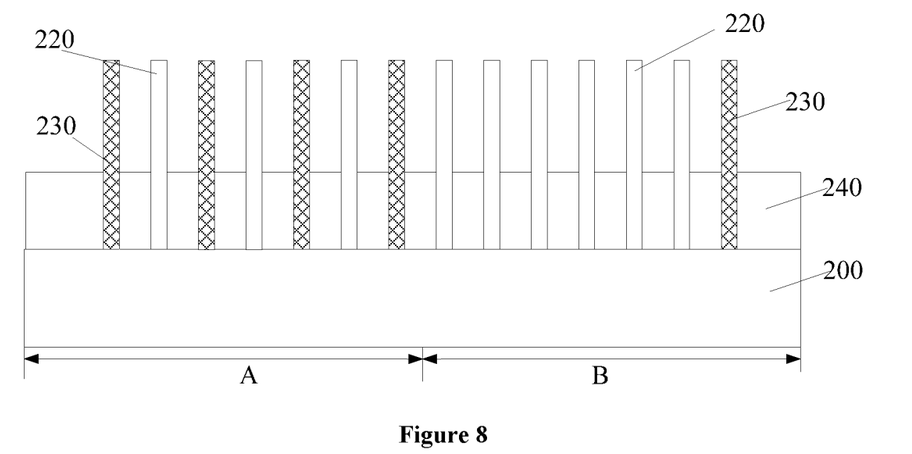

Returning to FIG. 16, after forming the plurality of discrete fin rings, a first isolation layer may be formed (S103). FIGS. 7-8 illustrate a corresponding semiconductor structure. FIG. 7 illustrates a schematic diagram formed on the basis of FIG. 5, FIG. 8 illustrates a schematic diagram formed on the basis of FIG. 6, and FIG. 8 illustrates a cross-sectional view along a line 'M-M1' in FIG. 7.

Referring to FIGS. 7-8, a first isolation layer 240 may be formed on the semiconductor substrate 200. The first isolation layer 240 may cover a portion of sidewalls of the dummy fins 230 and a portion of sidewalls of the intrinsic fins 220. The first isolation layer 240 may be made of silicon oxide.

Forming the first isolation layer 240 may include forming a first isolation material layer (not illustrated) on the semiconductor substrate 200, on the dummy fins 230, on the first fin group, and on the second fin group; and forming the first isolation layer 240 from the first isolation material layer by back-etching a portion of the first isolation material layer.

In one embodiment, the first isolation material layer may also be formed on the additional fins. After forming the first isolation layer 240, the first isolation layer 240 may also cover a portion of sidewalls of the additional fins 212.

In one embodiment, a mask protection layer may be formed on surfaces of the intrinsic fins 220 and on a top surface of the first isolation layer 240, and the mask protection layer may expose surfaces of the dummy fins 230.

The dummy fins may be formed on both sides of the first fin group, on both sides of the second fin group, and between the adjacent intrinsic fins on the sparse region, respectively. Therefore, the difference between a spacing between the intrinsic fin and an adjacent dummy fin on the sparse region, a spacing between the adjacent intrinsic fins on the dense region, and a spacing between the intrinsic fin and an adjacent dummy fin on the dense region may be substantially small. Further, source gases for forming the first isolation material layer may be uniformly distributed between the intrinsic fin and an adjacent dummy fin on the sparse region, between the adjacent intrinsic fins on the dense region, and between the intrinsic fin and an adjacent dummy fin on the dense region. After forming the first isolation layer, the first isolation layer between the intrinsic fin and an adjacent dummy fin on the sparse region, the first isolation layer between the adjacent intrinsic fins on the dense region, and the first isolation layer between the intrinsic fin and an adjacent dummy fin on the dense region may have a uniform height. Therefore, the height difference between the first isolation layers on both sides of each intrinsic fin on the dense region and the sparse region may be substantially small, which may satisfy the requirements of the process design.

A height of the first isolation layer 240 may be referred to a dimension of the first isolation layer 240 in a direction perpendicular to the surface of the semiconductor substrate 200.

The spacing between the intrinsic fin and an adjacent dummy fin on the sparse region, the spacing between the adjacent intrinsic fins on the dense region, and the spacing between the intrinsic fin and an adjacent dummy fin on the dense region may be substantially consistent. For convenience of description, the process of etching the fin material layer to form the intrinsic fins and the dummy fins may be referred to a fin etching process. The consumption degree of etching gas between the intrinsic fin and an adjacent dummy fin on the sparse region may be substantially consistent with the consumption degree of etching gas between the adjacent intrinsic fins on the dense region and between the intrinsic fin and an adjacent dummy fin on the dense region. The degree of etch loading effects between the intrinsic fin and an adjacent dummy fin on the sparse region, between the adjacent intrinsic fins on the dense region, and between the intrinsic fin and an adjacent dummy fin on the dense region may be substantially consistent. Therefore, the width difference of the intrinsic fins on the sparse region and on the dense region may be substantially small.

Although the widths of the dummy fins on both sides of the first fin group and on both sides the second fin group are significantly different from the width of the intrinsic fin, the dummy fins may be subsequently removed and the intrinsic fins may be retained. The intrinsic fins may be effective fins in the process.

A plurality of first trenches may be subsequently formed in the first isolation layer 240 by removing the dummy fins 230. In one embodiment, when removing the dummy fins 230, a plurality of second trenches may be formed in the first isolation layer 240 by removing the additional fins 212.

In one embodiment, before removing the dummy fins 230, a mask protection layer may be formed on the surfaces of the intrinsic fins 220 and on the top surface of the first isolation layer 240, and the mask protection layer may expose the surfaces of the dummy fins 230. The dummy fins 230 may be removed by etching using the mask protection layer as a mask to form the plurality of first trenches in the first isolation layer 240.

Figure 9:
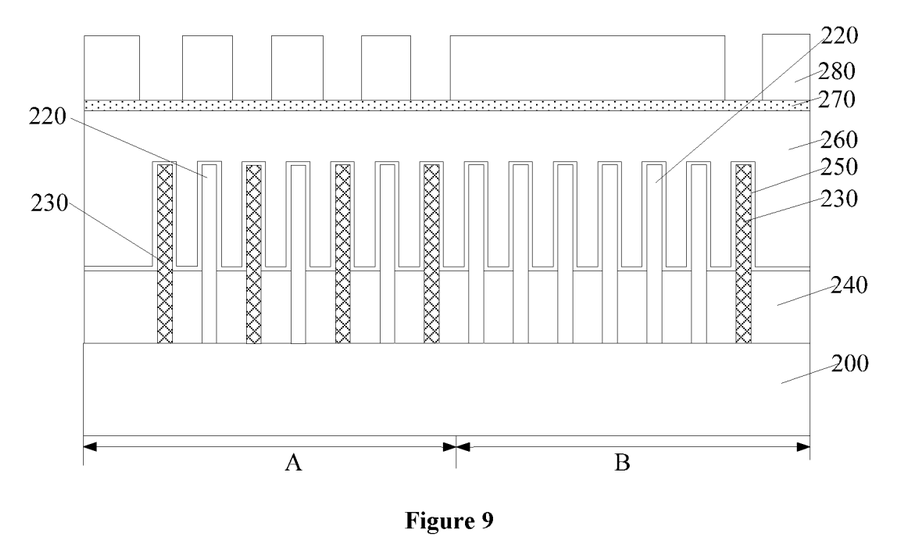

Returning to FIG. 16, after forming the first isolation layer, a mask protection material layer, a planarization layer, a bottom anti-reflective layer, and a patterned photoresist layer may be formed (S104). FIG. 9 illustrates a corresponding semiconductor structure. FIG. 9 illustrates a schematic diagram formed on the basis of FIG. 8.

Referring to FIG. 9, a mask protection material layer 250 may be formed on the surfaces of the intrinsic fins 220, on the surfaces of the dummy fins 230, and on the top surface of the first isolation layer 240. A planarization layer 260 may be formed on the mask protection material layer 250. An entire top surface of the planarization layer 260 may be above the mask protection material layer 250 on the top surfaces of the intrinsic fins 220 and the mask protection material layer 250 on the top surfaces of the dummy fins 230. A bottom anti-reflective layer 270 may be formed on a surface of the planarization layer 260. A patterned photoresist layer 280 may be formed on the bottom anti-reflective layer 270.

The mask protection material layer 250 may also be formed on the surfaces of the additional fins 212. The top surface of the planarization layer 260 may also be above the mask protection material layer 250 on the top surfaces of the additional fins 212.

In one embodiment, the mask protection material layer 250 may be a single-layer structure. The mask protection material layer 250 may be made of silicon nitride ($SiN_x$), silicon carbonitride, silicon boron nitride, titanium nitride, or tantalum nitride, etc.

In certain embodiments, the mask protection material layer may be a stacked-layer structure. Correspondingly, the mask protection material layer may include a first protection material layer and a second protection material layer on a surface of the first protection material layer. The first protection material layer may be formed on the surfaces of the intrinsic fins, on the surfaces of the dummy fins, on the surfaces of the additional fins, and on the top surface of the first isolation layer. The first protection material layer may be made of silicon oxide, and the second protection material layer may be made of silicon nitride ($SiN_x$), silicon carbonitride, silicon boron nitride, titanium nitride, or tantalum nitride, etc.

Forming the mask protection material layer 250 may include a deposition process. Forming the first protection material layer may include an oxidation process. If the second protection material layer is directly formed on the surfaces of the intrinsic fins 220, on the surfaces of the dummy fins 230, and on the top surface of the first isolation layer 240, the second protection material layer may produce a substantially large stress on the instinct fins 220, and the adhesion between the second protection material layer and the intrinsic fins 220 may be substantially poor. The first protection material layer may be used to buffer the stress on the intrinsic fins 220 produced by the second protection material layer, and improve the bonding force between the second protection material layer and the intrinsic fins 220.

In one embodiment, forming the mask protection material layer 250 may include an atomic layer deposition process, which may enable the mask protection material layer 250 to have a desired thickness uniformity. Therefore, a thickness of the mask protection material layer 250 on the sidewall surfaces of the intrinsic fins 220 may be prevented from being less than a thickness of the mask protection material layer 250 on the top surfaces of the intrinsic fins 220, which may improve the protection capability of the mask protection material layer 250 to the sidewall surfaces of the intrinsic fins 220.

The planarization layer 260 may be made of a carbon-based organic polymer. The patterned photoresist layer 280 may be used to define positions of the first trenches and second trenches.

Figure 10:
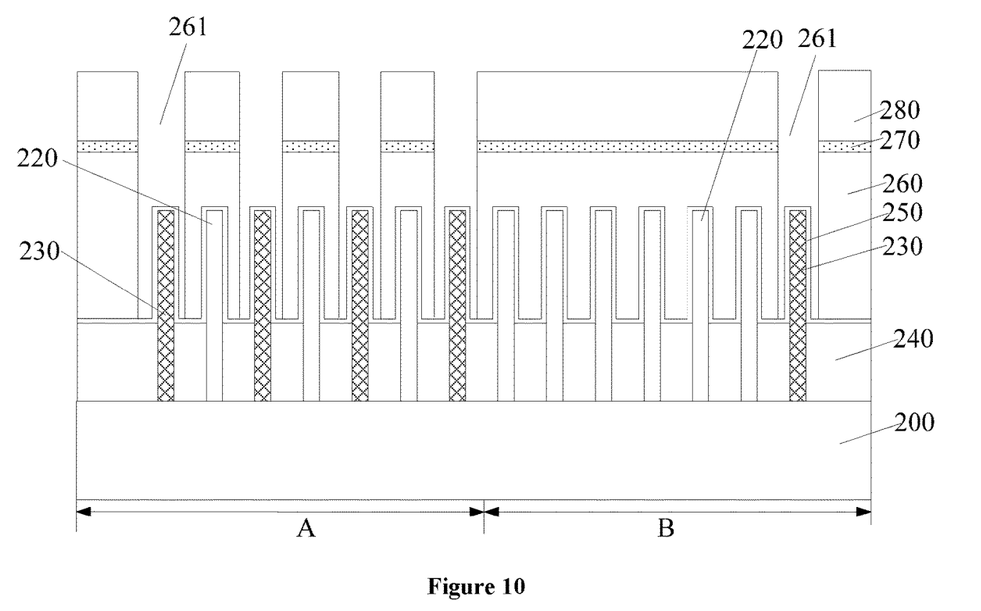

Returning to FIG. 16, after forming the patterned photoresist layer, a plurality of first openings may be formed (S105). FIG. 10 illustrates a corresponding semiconductor structure.

Referring to FIG. 10, the bottom anti-reflective layer 270 and the planarization layer 260 may be etched using the photoresist layer 280 as a mask to form a plurality of first openings 261 and a plurality of second openings penetrating through the bottom anti-reflective layer 270 and the planarization layer 260. The first opening 261 may expose the mask protection material layer 250 on the surface of the dummy fin 230, and the second opening may expose the mask protection material layer 250 on the surface of the additional fin 212.

Figure 11:
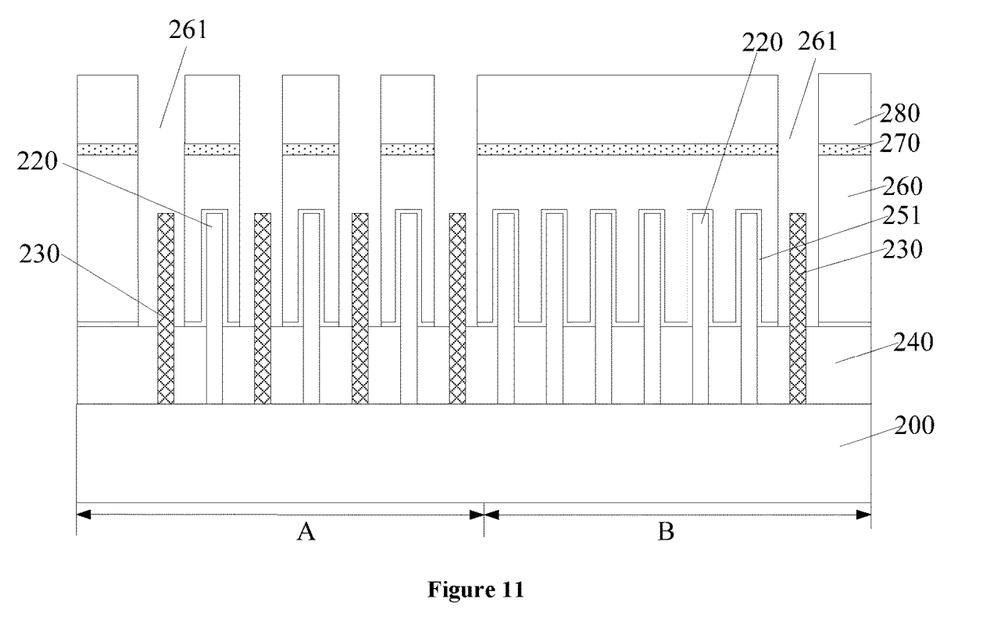

Returning to FIG. 16, after forming the first openings, a mask protection layer may be formed (S106). FIG. 11 illustrates a corresponding semiconductor structure.

Referring to FIG. 11, a mask protection layer 251 may be formed from the mask protection material layer 250 by removing the mask protection material layer 250 at the bottoms of the first openings 261 to expose the surfaces of the dummy fins 230 by the first openings 261. When removing the mask protection material layer 250 at the bottoms of the first openings 261, the mask protection material layer 250 at the bottoms of the second openings may be removed to expose the surfaces of the additional fins 212 by the second openings.

A thickness of the mask protection layer 251 may be in a range of approximately 2 nm-10 nm. If the thickness of the mask protection layer 251 is too small, a mask effect of the mask protection layer 251 may be poor. If the thickness of the mask protection layer 251 is too thick, a spacing between the mask protection layer 251 on a sidewall of the intrinsic fin 220 and the mask protection layer 251 on a sidewall of an adjacent dummy fin 230 opposing to the sidewall of the intrinsic fin 220 may be substantially small, and the mask protection material layer 250 at the bottom of the sidewalls of the dummy fins 230 may be hardly removed by etching.

In on embodiment, the mask protection layer 251 may be a single-layer structure. The mask protection layer 251 may be made of silicon nitride ($SiN_x$), silicon carbonitride, silicon boron nitride, titanium nitride, or tantalum nitride, etc.

In another embodiment, the mask protection layer may be a stacked-layer structure, and the mask protection layer may include a first protection layer and a second protection layer on a surface of the first protection layer. The first protection layer may be formed on the surfaces of the intrinsic fins and on the top surface of the first isolation layer, and the first protection layer may expose the surfaces of the dummy fins. The first protection layer may correspond to the first protection material layer, and the second protection layer may correspond to the second protection material layer. The first protection layer may be made of silicon oxide, and the second protection layer may be made of silicon nitride ($SiN_x$), silicon carbonitride, silicon boron nitride, titanium nitride, or tantalum nitride, etc.

Figure 12:
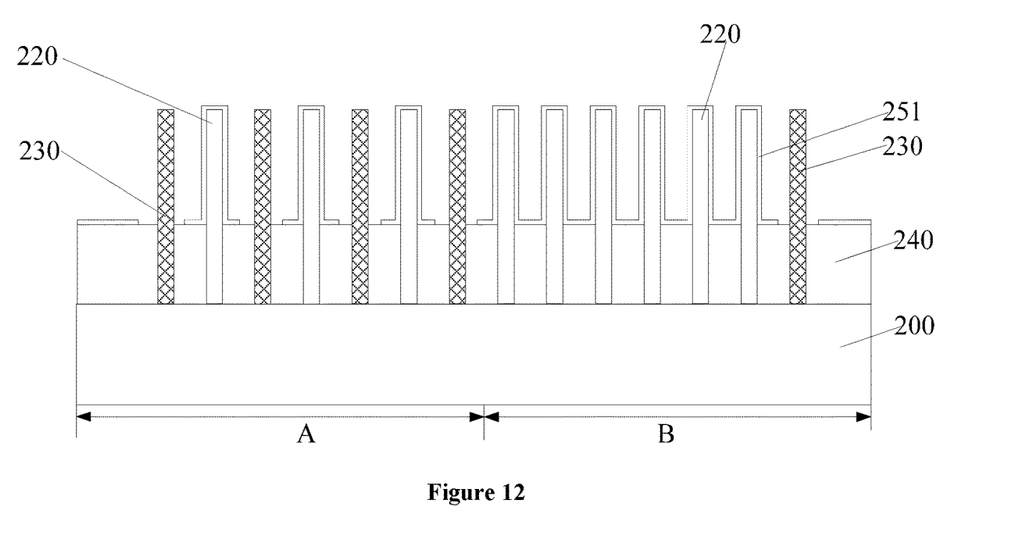

Returning to FIG. 16, after forming the mask protection layer, the photoresist layer, the bottom anti-reflective layer and the planarization layer may be removed (S107). FIG. 12 illustrates a corresponding semiconductor structure.

Referring to FIG. 12, after removing the mask protection material layer 250 at the bottoms of the first openings 261 and the second openings, the photoresist layer 280, the bottom anti-reflective layer 270 and the planarization layer 260 may be removed.

Figure 13:
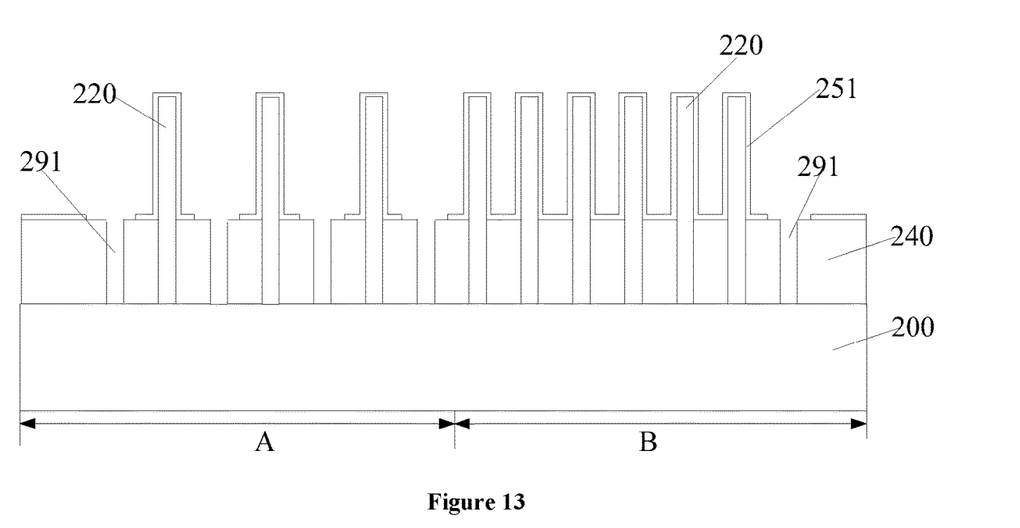

Returning to FIG. 16, after removing the photoresist layer, the bottom anti-reflective layer and the planarization layer, a plurality of first trenches may be formed (S108). FIG. 13 illustrates a corresponding semiconductor structure.

Referring to FIG. 13, after removing the photoresist layer 280, the bottom anti-reflective layer 270 and the planarization layer 260, the dummy fins 230 may be removed by etching using the mask protection layer 251 as a mask to form a plurality of first trenches 291 in the first isolation layer 240.

When removing the dummy fins 230, the additional fins 212 may be removed by etching using the mask protection layer 251 as a mask to form a plurality of second trenches in the first isolation layer 240.

Because the dummy fins 230 and the additional fins 212 are removed by etching using the mask protection layer 251 as a mask, and the mask protection layer 251 is a hard mask layer, when removing the dummy fins 230 and the additional fins 212 by etching, a ratio of an etching rate on the dummy fins 230 over an etching rate on the mask protection layer 251 may be substantially large, and a ratio of an etching rate on the additional fins 212 over the etching rate on the mask protection layer 251 may be substantially large. Correspondingly, the loss of the mask protection layer 251 may be substantially small, such that the mask protection layer 251 may effectively protect the top surface of the first isolation layer 240 near both sides of each intrinsic fin 220. In one embodiment, when removing the dummy fins 230 and the additional fins 212 by etching, the ratio of the etching rate on the dummy fins 230 over the etching rate on the mask protection layer 251 may be in a range of approximately 100:1-1000:1, and the ratio of the etching rate on the additional fins 212 over the etching rate on the mask protection layer 251 may be in a range of approximately 100:1-1000:1.

In certain embodiments, the mask protection layer may not be formed. For example, a planarization layer may be formed on the intrinsic fins, on the dummy fins, on the additional fins, and on the first isolation layer. An entire top surface of the planarization layer may be above the top surfaces of the intrinsic fins, the top surfaces of the dummy fins, and the top surfaces of the additional fins. A bottom anti-reflective layer may be formed on a surface of the planarization layer, and a patterned photoresist layer may be formed on a surface of the bottom anti-reflective layer. The bottom anti-reflective layer and the planarization layer may be etched using the photoresist layer as a mask to form first openings and second openings penetrating through the bottom anti-reflective layer and the planarization layer. The first opening may expose the surface of the dummy fin, and the second opening may expose the surface of the additional fin. Using the photoresist layer, the bottom anti-reflective layer and the planarization layer as a mask, the dummy fins may be removed by etching to form first trenches in the first isolation layer, the additional fins may be removed by etching to form second trenches in the first isolation layer.

Returning to FIG. 16, after forming first trenches, a second isolation layer may be formed (S109). FIG. 14 illustrates a corresponding semiconductor structure.

Referring to FIG. 14, a second isolation layer 300 may be formed in the first trenches 291. The second isolation layer 300 may be made of silicon oxide. In one embodiment, the second isolation layer 300 may be formed in the first trenches 291 and in the second trenches.

Forming the second isolation layer 300 may include: forming a second isolation material layer in the first trenches 291, in the second trenches, and on the mask protection layer 251; planarizing the second isolation material layer until the mask protection layer 251 on the top surfaces of the intrinsic fins 220 are exposed to form a second isolation transition layer from the second isolation material layer; and back-etching a portion of the second isolation transition layer using the mask protection layer 251 as a mask to form the second isolation layer 300.

Forming the second isolation material layer may include a deposition process, e.g., a fluid chemical vapor deposition process, which may have desired filling capability. In one embodiment, the second isolation material layer may be formed by a fluid chemical vapor deposition process. When forming the second isolation material layer, the mask protection layer 251 may protect the surfaces of the intrinsic fins 220, and the intrinsic fins 220 may be prevented from being consumed by an oxidation process in the fluid chemical vapor deposition process, and, thus, the widths of the intrinsic fins 220 may be prevented from being reduced by the fluid chemical vapor deposition process.

Planarizing the second isolation material layer may include a chemical mechanical polishing process, or a back-etching process, etc. The process of planarizing the second isolation material layer may use the mask protection layer 251 on the top surfaces of the intrinsic fins 220 as a stop layer. The mask protection layer 251 may protect the first isolation layer 240 when back-etching the portion of the second isolation transition layer, such that the first isolation layer 240 may be prevented from being subjected to etching damages, and the height of the first isolation layer 240 may be prevented from being changed.

Returning to FIG. 16, after forming second isolation layer, the mask protection layer may be removed (S110). FIG. 15 illustrates a corresponding semiconductor structure.

Referring to FIG. 15, after forming the second isolation layer 300, the mask protection layer 251 may be removed.

Removing the mask protection layer 251 may include a dry etching process, or a wet etching process, etc.

In one embodiment, a first gate structure may be formed on the first isolation layer 240 and on the second isolation layer 300. The first gate structure may cross a length portion of the intrinsic fin 220 on the sparse region 'A', and cover a portion of each of top and sidewall surfaces of the intrinsic fin 220 on the sparse region 'A'. A second gate structure may be formed on the first isolation layer 240 and on the second isolation layer 300. The second gate structure may cross a length portion of the intrinsic fin 220 on the dense region 'B', and cover a portion of each of top and sidewall surfaces of the intrinsic fin 220 on the dense region 'B'.

Because the height difference of the first isolation layers 240 on both sides of each intrinsic fin 220 on the sparse region 'A' is small, the heights of the sidewalls on both sides of the intrinsic fin 220 crossed by the first gate structure may be substantially uniform. The first gate structure may have a substantially consistent control over the channels on both insides of the intrinsic fin 220, reducing the leakage in the transistor corresponding to the sparse region 'A'. Because the height difference of the first isolation layers 240 on both sides of each intrinsic fin 220 on the dense region 'B' is small, the heights of the sidewalls on both sides of the intrinsic fin 220 crossed by the second gate structure may be substantially uniform. The second gate structure may have a substantially consistent control over the channels on both insides of the intrinsic fin 220, reducing the leakage in the transistor corresponding to the dense region 'B'.

Accordingly, the present disclosure also provides a semiconductor device. FIG. 15 illustrates a cross-sectional view of the semiconductor device. Referring to FIG. 15, the semiconductor device may include a semiconductor substrate 200. The semiconductor substrate 200 may include a sparse region 'A' and a dense region 'B'. In one embodiment, the semiconductor substrate 200 may be made of monocrystalline silicon, polysilicon, or amorphous silicon. In another embodiment, the semiconductor substrate 200 may be made of silicon, germanium, silicon germanium, or any other suitable semiconductor material(s). In one embodiment, the semiconductor substrate 200 may be made of monocrystalline silicon.

The semiconductor device may also include a plurality of intrinsic fins 220 on the semiconductor substrate 200. A spatial density of the intrinsic fins 220 on the dense region 'B' may be greater than a spatial density of the intrinsic fins 220 on the sparse region 'A'.

In addition, the semiconductor device may include an isolation structure, formed by a first isolation layer 240 and a second isolation layer 300, on the semiconductor substrate 200 between adjacent intrinsic fins. A top of the first isolation layer 240 may be lower than a height of the intrinsic fin 220, and the first isolation layer 240 may cover a portion of sidewalls of the intrinsic fin 220. The height difference of the first isolation layers 240 on both sides of each intrinsic fin 220 on both the sparse region 'A' and the dense region 'B' may be substantially small. The first isolation layer 240 may be made of silicon oxide. A top of the second isolation layer 300 may be coplanar with the top of the first isolation layer 240. The second isolation layer 300 may be made of silicon oxide.

In the disclosed method for forming the semiconductor device, the dummy fins may be formed, and the dummy fins may be used to improve the height uniformity of the first isolation layer. After forming the first isolation layer, the dummy fins may be removed, and the intrinsic fins may be retained on the sparse region and the dense region of the semiconductor substrate. The spatial density of the intrinsic fins on the dense regions may be greater than the spatial density of the intrinsic fins on the sparse region. The second isolation layer may be subsequently formed in the first trenches, and the second isolation layer and the first isolation layer may be used to form the isolation structure between the intrinsic fins. The dummy fins may be formed on both sides of the first fin group, on both sides of the second fin group, and between adjacent intrinsic fins on the sparse region, respectively. Therefore, the difference between the spacing between the intrinsic fin and an adjacent dummy fin on the sparse region, the spacing between the adjacent intrinsic fins on the dense region, and the spacing between the intrinsic fin and an adjacent dummy fin on the dense region may be substantially small. Further, the source gases for forming the first isolation material layer may be uniformly distributed between the intrinsic fin and an adjacent dummy fin on the sparse region, between the adjacent intrinsic fins on the dense region, and between the intrinsic fin and an adjacent dummy fin on the dense region. After forming the first isolation layer, the first isolation layer between the intrinsic fin and an adjacent dummy fin on the sparse region, the first isolation layer between the adjacent intrinsic fins on the dense region, and the first isolation layer between the intrinsic fin and an adjacent dummy fin on the dense region may have a uniform height. Therefore, the height difference between the first isolation layers on both sides of each intrinsic fin on the dense region and the sparse region may be substantially small, which may satisfy the requirements of the process design and improve the performance of the semiconductor device.

Further, before removing the dummy fins, the mask protection layer may be formed on the surfaces of the intrinsic fins and on the top surface of the first isolation layer, and the mask protection layer may expose the surfaces of the dummy fins. When removing the dummy fins by etching, the ratio of the etching rate on the dummy fins over the etching rate on the mask protection layer may be substantially large. Correspondingly, the loss of the mask protection layer may be substantially small, such that the mask protection layer may effectively protect the top surface of the first isolation layer near both sides of each intrinsic fin.

Further, when forming the second isolation layer, the mask protection layer may serve as the stop layer for planarizing the second isolation material layer, and protect the top surfaces of the intrinsic fins. The mask protection layer may protect the first isolation layer when back-etching the portion of the second isolation transition layer, such that the first isolation layer may be prevented from being subjected to etching damages, and the height of the first isolation layer may be prevented from being changed.

Further, the first gate structure may be formed on the first isolation layer and on the second isolation layer and the first gate structure may cross a length portion of the intrinsic fin on the sparse region. The second gate structure may be formed on the first isolation layer and on the second isolation layer, and the second gate structure may cross a length portion of the intrinsic fin on the dense region. Because the height difference of the first isolation layers on both sides of each intrinsic fin on the sparse region is small, the heights of the sidewalls on both sides of the intrinsic fin crossed by the first gate structure may be substantially uniform. The first gate structure may have a substantially consistent control over the channels on both insides of the intrinsic fin, reducing the leakage in the transistor corresponding to the sparse region. Because the height difference of the first isolation layers on both sides of each intrinsic fin on the dense region is small, the heights of the sidewalls on both sides of the intrinsic fin crossed by the second gate structure may be substantially uniform. The second gate structure may have a substantially consistent control over the channels on both insides of the intrinsic fin, reducing the leakage in the transistor corresponding to the dense region.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor device, comprising:
   providing a semiconductor substrate, wherein the semiconductor substrate includes a dense region and a sparse region;
   forming initial fins equally spaced apart from one another on the semiconductor substrate, the initial fins including a first fin group, a second fin group, and dummy fins, wherein the first fin group is formed on the sparse region of the semiconductor substrate, the second fin group is formed on the dense region of the semiconductor substrate, the first fin group and the second fin group each includes a plurality of intrinsic fins, a spatial density of the intrinsic fins on the dense region is greater than a spatial density of the intrinsic fins on the sparse region, and the dummy fins are formed on both sides of the first fin group, on both sides of the second fin group, and between adjacent intrinsic fins on the sparse region, respectively;
   forming a first isolation layer on the semiconductor substrate, wherein the first isolation layer covers a portion of sidewalls of the dummy fins and a portion of sidewalls of the intrinsic fins;
   forming first trenches in the first isolation layer by removing the dummy fins; and
   forming a second isolation layer in the first trenches.

2. The method according to claim 1, further including:
   before forming the first isolation layer, forming additional fins on the semiconductor substrate to provide a plurality of discrete fin rings, wherein:
   each fin ring includes initial fins and additional fins arranged along a rectangle shape,
   the initial fins are arranged as opposite sides, and
   the additional fins are arranged as opposite sides of the rectangle shape.

3. The method according to claim 2, wherein:
   after forming the first isolation layer, the first isolation layer further covers a portion of sidewalls of the additional fins; and
   second trenches are formed in the first isolation layer by removing the additional fins when removing the dummy fins, wherein after forming the second isolation layer, the second isolation layer is further formed in the second trenches.

4. The method according to claim 2, wherein forming the plurality of fin rings includes:
   forming a fin material layer on both the dense region and the sparse region of the semiconductor substrate;
   forming a plurality of discrete sacrificial layers on the fin material layer;
   forming first sidewall spacers and second sidewall spacers arranged along a rectangle shape on sidewalls of each sacrificial layer, wherein the first sidewall spacers are arranged as opposite sides, and the second sidewall spacers are arranged as opposite sides of the rectangle shape;
   after forming the first sidewall spacers and the second sidewall spacers, removing the sacrificial layers;
   after removing the sacrificial layers, etching the fin material layer using the first sidewall spacers and the second sidewall spacers as a mask to form the plurality of fin rings on both the dense region and the sparse region of the semiconductor substrate; and
   after etching the fin material layer using the first sidewall spacers and the second sidewall spacers as a mask, removing the first sidewall spacers and the second sidewall spacers.

5. The method according to claim 1, wherein forming the first isolation layer includes:
   forming a first isolation material layer on the semiconductor substrate, on the dummy fins, on the first fin group, and on the second fin group; and
   forming the first isolation layer from the first isolation material layer by back-etching a portion of the first isolation material layer.

6. The method according to claim 1, further including:
   before removing the dummy fins, forming a mask protection layer on surfaces of the intrinsic fins and on a top surface of the first isolation layer, wherein the mask protection layer exposes surfaces of the dummy fins;
   removing the dummy fins by etching using the mask protection layer as a mask to form the first trenches in the first isolation layer; and
   after forming the second isolation layer, removing the mask protection layer.

7. The method according to claim 6, wherein:
   when removing the dummy fins by etching, a ratio of an etching rate on the dummy fins over an etching rate on the mask protection layer is in a range of approximately 100:1-1000:1.

8. The method according to claim 6, wherein:
   the mask protection layer is a single-layer structure; and
   the mask protection layer is made of one of silicon nitride, silicon carbonitride, silicon boron nitride, titanium nitride, and tantalum nitride.

9. The method according to claim 6, wherein:
   the mask protection layer is a stacked-layer structure; and
   the mask protection layer includes a first protection layer and a second protection layer on a surface of the first protection layer, wherein the first protection layer is formed on the surfaces of the intrinsic fins and on the top surface of the first isolation layer, and the first protection layer exposes the surfaces of the dummy fins.

10. The method according to claim 9, wherein:
    the first protection layer is made of silicon oxide; and
    the second protection layer is made of one of silicon nitride, silicon carbonitride, silicon boron nitride, titanium nitride, and tantalum nitride.

11. The method according to claim 6, further including:
    before forming the mask protection layer, forming a mask protection material layer on the surfaces of the intrinsic fins, on the surfaces of the dummy fins, and on the top surface of the first isolation layer;
    forming a planarization layer on the mask protection material layer, wherein an entire top surface of the planarization layer is above the mask protection material layer on the top surfaces of the intrinsic fins and the mask protection material layer on the top surfaces of the dummy fins;

forming a bottom anti-reflective layer on a surface of the planarization layer;

forming a patterned photoresist layer on a surface of the bottom anti-reflective layer;

forming a plurality of first openings penetrating through the bottom anti-reflective layer and the planarization layer by etching the bottom anti-reflective layer and the planarization layer using the photoresist layer as a mask, wherein a first opening exposes the mask protection material layer on a surface of a dummy fin;

removing the mask protection material layer at bottoms of the plurality of first openings to enable the first opening to expose the surface of the dummy fin and to form the mask protection layer from the mask protection material layer;

after removing the mask protection material layer at the bottoms of the plurality of first openings, removing the photoresist layer, the bottom anti-reflective layer, and the planarization layer; and after removing the photoresist layer, the bottom anti-reflective layer, and the planarization layer, removing the dummy fins by etching using the mask protection layer as a mask.

12. The method according to claim 11, wherein:
forming the mask protection material layer includes an atomic layer deposition process.

13. The method according to claim 6, wherein forming the second isolation layer in the first trenches includes:
forming a second isolation material layer in the first trenches and on the mask protection layer;
planarizing the second isolation material layer until the mask protection layer on the top surfaces of the intrinsic fins are exposed to form a second isolation transition layer from the second isolation material layer; and
back-etching a portion of the second isolation transition layer using the mask protection layer as a mask to form the second isolation layer.

14. The method according to claim 13, wherein:
planarizing the second isolation material layer includes one of a chemical mechanical polishing process and a back-etching process.

15. The method according to claim 13, wherein:
forming the second isolation material layer includes a fluid chemical vapor deposition process.

16. The method according to claim 1, wherein:
the first isolation layer is made of silicon oxide; and
the second isolation layer is made of silicon oxide.

17. The method according to claim 1, further including:
forming a first gate structure on the first isolation layer and on the second isolation layer, wherein the first gate structure crosses a length portion of an intrinsic fin on the sparse region, and covers a portion of each of top and sidewall surfaces of the intrinsic fin on the sparse region; and
forming a second gate structure on the first isolation layer and on the second isolation layer, wherein the second gate structure crosses a length portion of the intrinsic fin on the dense region, and covers a portion of each of top and sidewall surfaces of the intrinsic fin on the dense region.

* * * * *